United States Patent
Chen

(10) Patent No.: US 12,117,718 B2
(45) Date of Patent: Oct. 15, 2024

(54) WAVELENGTH CONVERSION MODULE AND PROJECTOR

(71) Applicant: Coretronic Corporation, Hsin-Chu (TW)

(72) Inventor: Fa-Chih Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 638 days.

(21) Appl. No.: 17/321,521

(22) Filed: May 17, 2021

(65) Prior Publication Data

US 2022/0019137 A1    Jan. 20, 2022

(30) Foreign Application Priority Data

Jul. 16, 2020   (CN) .......................... 202021399277.3

(51) Int. Cl.
    *G03B 21/20*      (2006.01)
    *H01L 33/50*      (2010.01)
    *H01L 33/64*      (2010.01)

(52) U.S. Cl.
    CPC ........ *G03B 21/2033* (2013.01); *H01L 33/505* (2013.01); *H01L 33/507* (2013.01); *H01L 33/644* (2013.01)

(58) Field of Classification Search
    CPC ............ G03B 21/00–64; H01L 33/505; H01L 33/507; H01L 33/644; G02B 26/008
    See application file for complete search history.

(56) References Cited

U.S. PATENT DOCUMENTS

| | | |
|---|---|---|
| 2017/0099467 A1 | 4/2017 | Egawa |
| 2017/0353701 A1 | 12/2017 | Egawa |
| 2018/0031957 A1* | 2/2018 | Egawa ................ H04N 9/3158 |
| 2018/0095349 A1* | 4/2018 | Egawa ................ H04N 9/3161 |
| 2019/0146314 A1 | 5/2019 | Yoshikawa |

FOREIGN PATENT DOCUMENTS

| | | |
|---|---|---|
| CN | 1797181 | 7/2006 |
| CN | 104216208 | 4/2017 |
| TW | I579634 | 4/2017 |
| TW | M555485 | 2/2018 |
| TW | I639852 | 11/2018 |

* cited by examiner

*Primary Examiner* — Bao-Luan Q Le
*Assistant Examiner* — Christopher A Lamb, II
(74) *Attorney, Agent, or Firm* — JCIPRNET

(57) ABSTRACT

A wavelength conversion module includes a driving assembly, a wavelength conversion substrate, and a clamping element. The driving assembly is connected to the wavelength conversion substrate to drive the wavelength conversion substrate to rotate around a central axis of the driving assembly. The clamping element is attached to the wavelength conversion substrate along the central axis. At least one of the wavelength conversion substrate and the clamping element includes at least one recess and at least one through hole. A direction of the through hole is parallel to the central axis, and the clamping element, the recess, and the wavelength conversion substrate define at least one heat dissipation channel. The through hole is relatively adjacent to the central axis and is in communication with the heat dissipation channel.

20 Claims, 14 Drawing Sheets

WAVELENGTH CONVERSION MODULE AND PROJECTOR

CROSS-REFERENCE TO RELATED APPLICATION

This application claims the priority benefit of China application serial no. 202021399277.3, filed on Jul. 16, 2020. The entirety of the above-mentioned patent application is hereby incorporated by reference herein and made a part of this specification.

BACKGROUND OF THE INVENTION

1. Field of the Invention

The invention relates to an optical module and a projector, and in particular, to a wavelength conversion module and a projector having the wavelength conversion module.

2. Description of Related Art

In an apparatus of a solid-state light source laser (SSI laser) projector, a phosphor wheel is located on a transmission path of an illumination beam of the light source module, and a blue excitation beam is projected on a light conversion region of the phosphor wheel to excite a yellow beam, so as to obtain white light through combination. However, the phosphor wheel, front and rear cover plates, and a motor are in contact with each other. When a phosphor layer on the light conversion region of the phosphor wheel is excited, the heat generated may be directly transmitted to the front and rear cover plates and the motor before it is dissipated. Because the front and rear cover plates and the motor cannot effectively block heat, and a closer distance to a rotation axis causes a poorer heat dissipation effect, resulting in continuous accumulation of heat, which leads to increase in the temperature of the entire phosphor wheel, which in turn causes reliability problems.

The information disclosed in this Background of the invention section is only for enhancement of understanding of the background of the described technology and therefore it may contain information that does not form the prior art that is already known to a person of ordinary skill in the art. Further, the information disclosed in the Background of the invention section does not mean that one or more problems to be resolved by one or more embodiments of the invention was acknowledged by a person of ordinary skill in the art.

SUMMARY OF THE INVENTION

The invention provides a wavelength conversion module, which has better heat dissipation effect.

The invention further provides a projector including the above-mentioned wavelength conversion module, which has better projection quality and product competitiveness.

In order to achieve one or a portion of or all of the above objects or other objects, an embodiment of the invention provides a wavelength conversion module, including a driving assembly, a wavelength conversion substrate, and a clamping element. The driving assembly is connected to the wavelength conversion substrate to drive the wavelength conversion substrate to rotate around a central axis of the driving assembly. The clamping element is attached to the wavelength conversion substrate along the central axis. At least one of the wavelength conversion substrate and the clamping element includes at least one recess and at least one through hole. A direction of the through hole is parallel to the central axis, and the clamping element, the recess, and the wavelength conversion substrate define at least one heat dissipation channel. The through hole is disposed relatively adjacent to the central axis and is in communication with (connected to) the heat dissipation channel.

In order to achieve one or a portion of or all of the above objects or other objects, an embodiment of the invention provides a projector, including an illumination module, a light valve, and a projection lens. The illumination module is configured to provide an illumination beam, and includes a light source apparatus and a wavelength conversion module. The light source apparatus is configured to provide an excitation beam. The wavelength conversion module is configured to receive the excitation beam, and is disposed on a transmission path of the illumination beam. The wavelength conversion module includes a driving assembly, a wavelength conversion substrate, and a clamping element. The driving assembly is connected to the wavelength conversion substrate to drive the wavelength conversion substrate to rotate around a central axis of the driving assembly. The clamping element is attached to the wavelength conversion substrate along the central axis. At least one of the wavelength conversion substrate and the clamping element includes at least one recess and at least one through hole. A direction of the through hole is parallel to the central axis, and the clamping element, the recess, and the wavelength conversion substrate define at least one heat dissipation channel. The through hole is disposed relatively adjacent to the central axis and is in communication with (connected to) the heat dissipation channel. The light valve is disposed on the transmission path of the illumination beam to convert the illumination beam into an image beam. The projection lens is disposed on a transmission path of the image beam to project the image beam from the projector.

Based on the above description, the embodiments of the invention have at least one of the following advantages or effects. In the design of the wavelength conversion module of the invention, at least one of the wavelength conversion substrate and the clamping element includes at least one recess and at least one through hole, the clamping element, the recess, and the wavelength conversion substrate define at least one heat dissipation channel, and the through hole is an axial through hole relatively adjacent to the central axis and in communication with the heat dissipation channel. Therefore, during rotation of the wavelength conversion module, a heat dissipation airflow can be directly directed around the central axis, and the heat dissipation efficiency around the central axis can be increased through forced heat dissipation. In this way, the wavelength conversion module of the invention can have a better heat dissipation effect. In addition, a projector adopting the wavelength conversion module of the invention can have better projection quality and product competitiveness.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
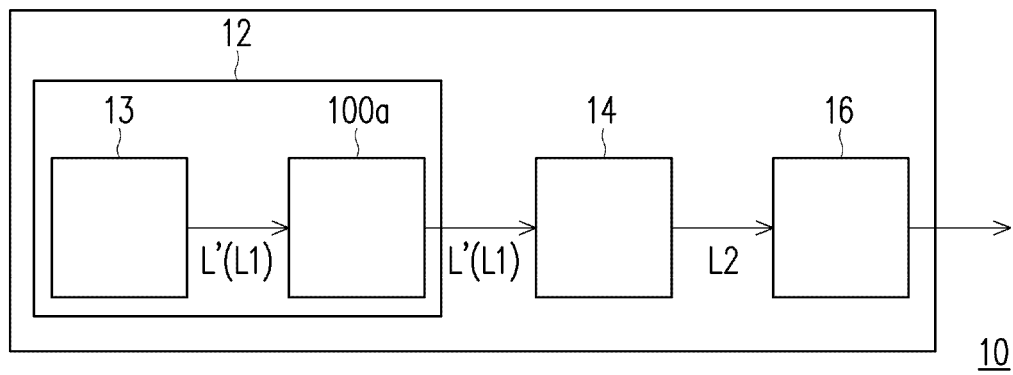
FIG. 1 is a schematic diagram of a projector according to an embodiment of the invention.

FIG. 1 is a schematic diagram of a projector according to an embodiment of the invention. Referring to FIG. 1, in the embodiment, a projector 10 includes an illumination module 12, a light valve 14, and a projection lens 16. The illumination module 12 is configured to provide an illumination beam L1, and includes a light source apparatus 13 and a wavelength conversion module 100a. The light source apparatus 13 is configured to provide an excitation beam L'. The wavelength conversion module 100a is, for example, a phosphor wheel configured to receive the excitation beam L'. The wavelength conversion module 100a is disposed on a transmission path of the illumination beam L1, and is configured to convert a wavelength of the excitation beam L' to generate converted beams with different wavelengths. Herein, the illumination beam L1 includes the excitation beam L' and the converted beam. The light valve 14 is disposed on the transmission path of the illumination beam L1 to convert the illumination beam L1 into an image beam L2. The projection lens 16 is disposed on a transmission path of the image beam L2 to project the image beam L2 from the projector 10.

Furthermore, the light source apparatus 13 used in the embodiment is, for example, a laser diode (LD), for example, a laser diode array (laser diode bank). In detail, any light source that meets a volume requirement in actual designing can be implemented, and the invention is not limited thereto. The light valve 14 is, for example, a reflective light modulator such as a liquid crystal on silicon panel (LCoS panel) or a digital micro-mirror device (DMD), etc. In an embodiment, the light valve 14 is, for example, a penetration optical modulator such as a transparent liquid crystal panel, an electro-optical modulator, a magneto-optic modulator, or an acousto-optic modulator (AOM), etc. However, a shape and a type of the light valve 14 are not limited in the embodiment. For specific steps and implementations of a method for modulating the illumination beam L1 (the excitation beam L' and the converted beam) into the image beam L2 by the light valve 14, sufficient instructions, advices, and implementation descriptions may be obtained from general knowledge of the technical field, and the descriptions thereof are omitted. In addition, the projection lens 16 includes, for example, a combination of one or more dioptric optical lenses, for example, includes various combinations of non-planar lenses such as a biconcave lens, a biconvex lens, a concave-convex lens, a convex-concave lens, a plano-convex lens, and a plano-concave lens, etc. In an embodiment, the projection lens 16 may also include a planar optical lens to convert the image beam from the light valve 14 into a projection beam and project the projection beam from the projector in a reflection or penetration manner. A shape and a type of the projection lens 16 are not limited in the embodiment herein.

Figure 2A:
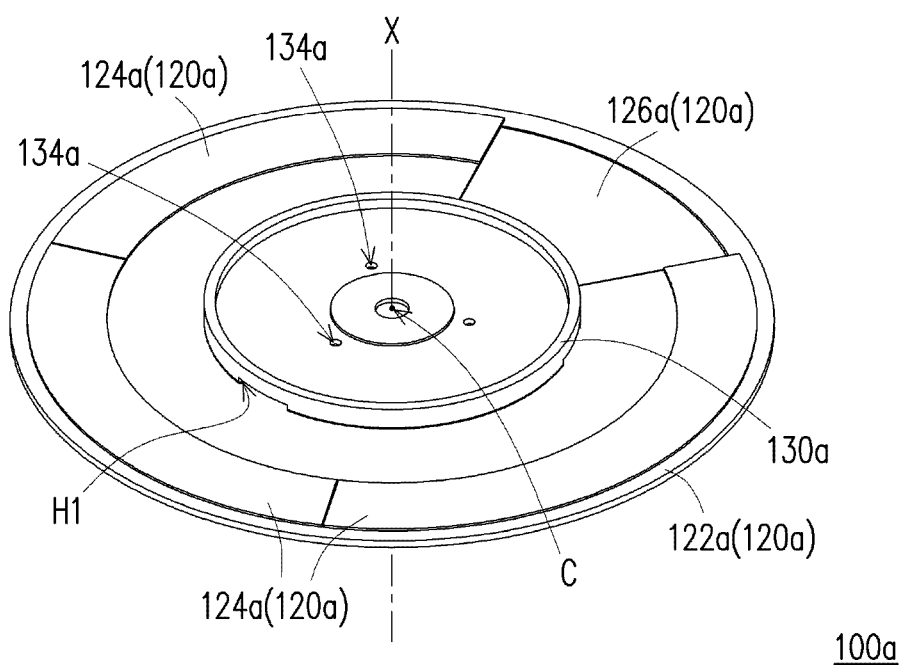
FIG. 2A is a three-dimensional schematic diagram of a wavelength conversion module according to an embodiment of the invention.
Figure 2B:
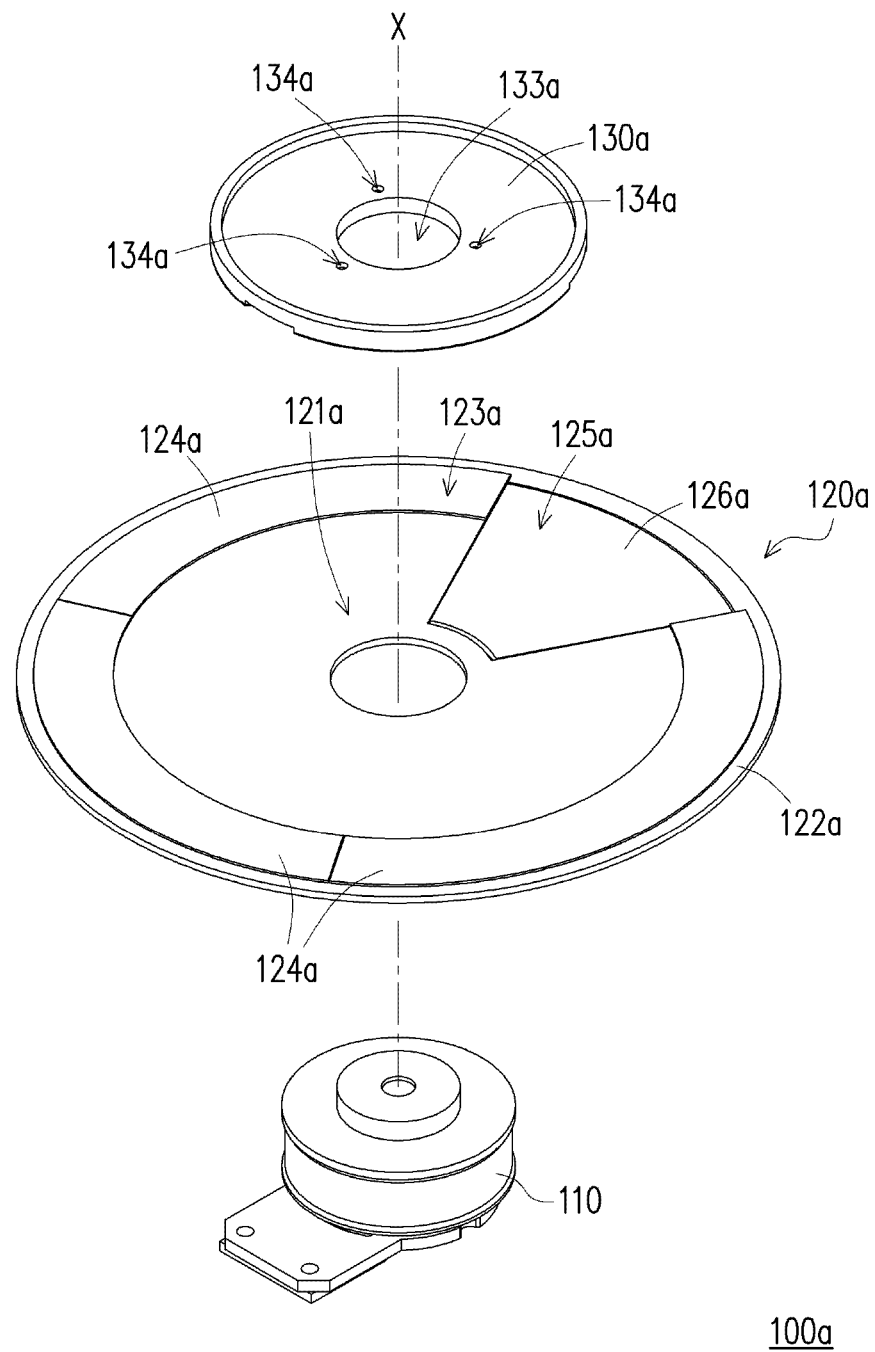
FIG. 2B is a three-dimensional schematic exploded view of the wavelength conversion module in FIG. 2A.
Figure 2C:
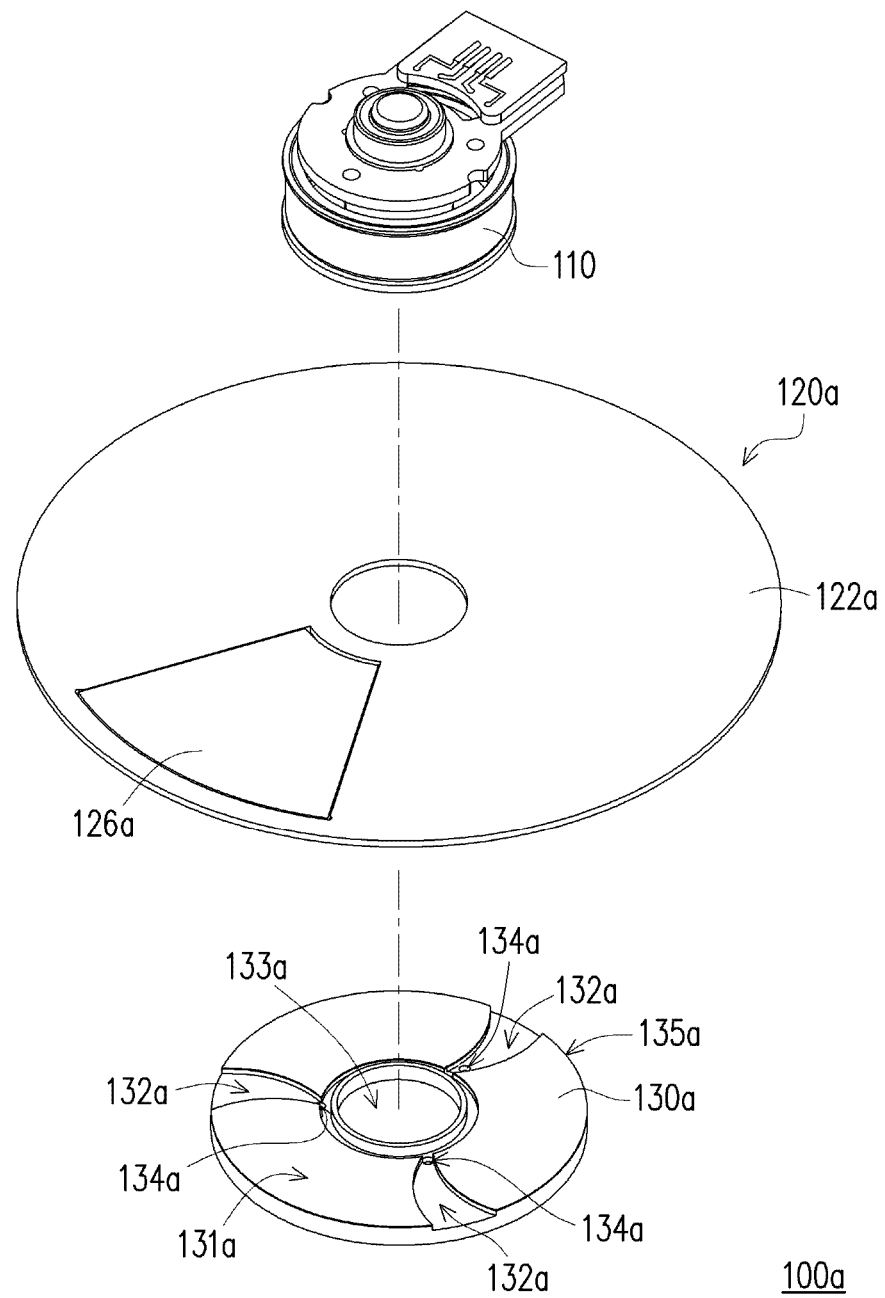
FIG. 2C is a three-dimensional schematic exploded view of the wavelength conversion module in FIG. 2A from another perspective.
Figure 2D:
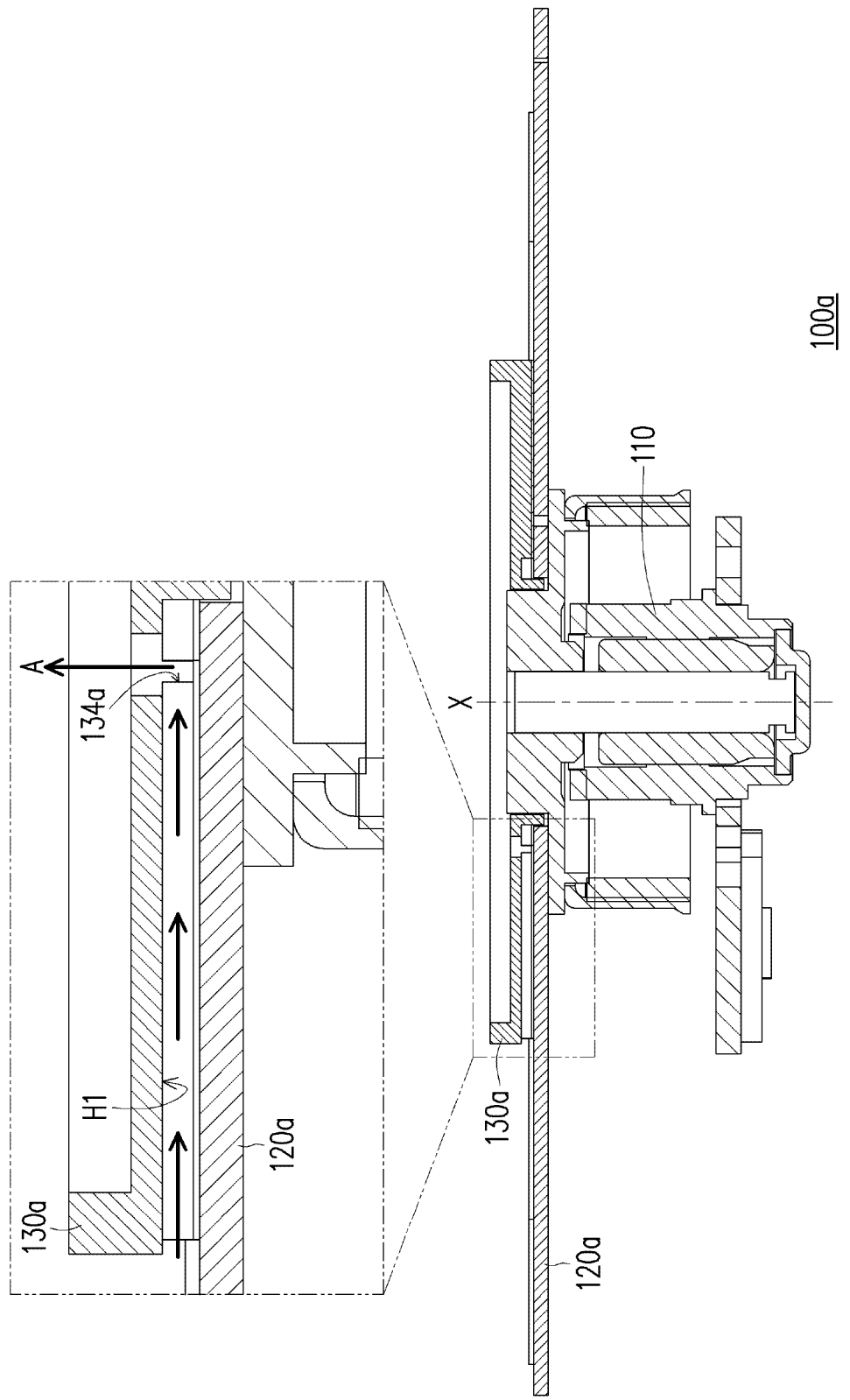
FIG. 2D is a schematic cross-sectional view of the wavelength conversion module in FIG. 2A.
Figure 2E:
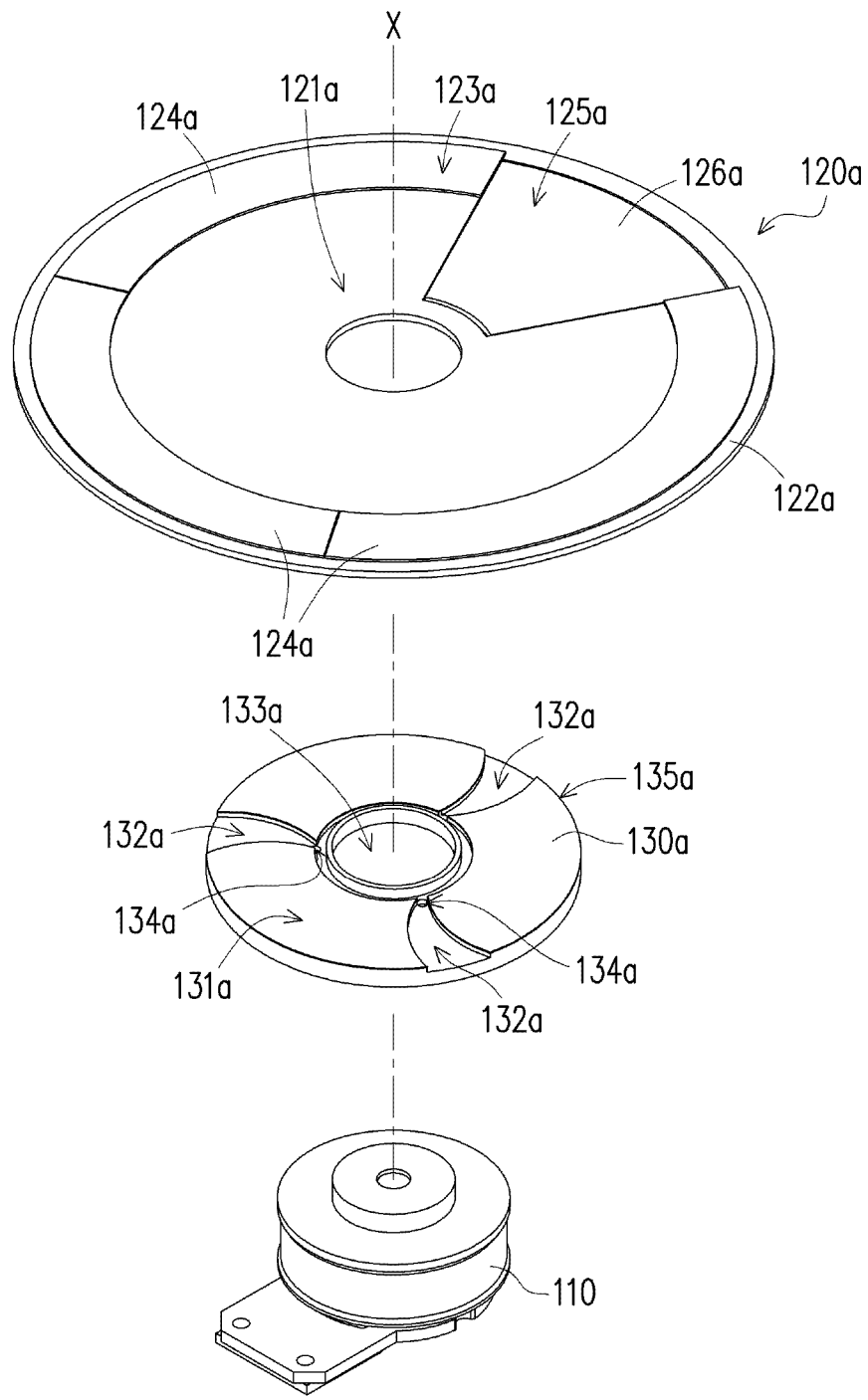
FIG. 2E is a three-dimensional schematic diagram of a wavelength conversion module according to another embodiment of the invention.

FIG. 2A is a three-dimensional schematic diagram of a wavelength conversion module according to an embodiment of the invention. FIG. 2B is a three-dimensional schematic exploded view of the wavelength conversion module in FIG. 2A. FIG. 2C is a three-dimensional schematic exploded view of the wavelength conversion module in FIG. 2A from another perspective. FIG. 2D is a schematic cross-sectional view of the wavelength conversion module in FIG. 2A. FIG. 2E is a three-dimensional schematic diagram of a wavelength conversion module according to another embodiment of the invention.

Referring to all of FIG. 2A, FIG. 2B, FIG. 2C, and FIG. 2D first, in the embodiment, a wavelength conversion module 100a includes a driving assembly 110, a wavelength conversion substrate 120a, and a clamping element 130a. The driving assembly 110 is connected to the wavelength conversion substrate 120a to drive the wavelength conversion substrate 120a to rotate around a central axis X of the driving assembly 110. The clamping element 130a is attached to the wavelength conversion substrate 120a along the central axis X. At least one of the wavelength conversion substrate 120a and the clamping element 130a includes at least one recess and at least one through hole. Herein, as shown in FIG. 2C, the clamping element 130a includes three recesses 132a and three through holes 134a herein, but the invention is not limited thereto. An extending direction of the through hole 134a is parallel to the central axis X. The through hole 134a penetrates the clamping element 130a. Herein, the through hole 134a may be considered as an axial through hole. In particular, the clamping element 130a, the recesses 132a, and the wavelength conversion substrate 120a define at least one heat dissipation channel (three heat dissipation channels H1 are schematically shown).

In detail, the driving assembly 110 in the embodiment is, for example, a motor, but the invention is not limited thereto. A shape of the wavelength conversion substrate 120a and a shape of the clamping element 130a are respectively a hollow ring. The wavelength conversion substrate 120a and the clamping element 130a are respectively disposed coaxially with the driving assembly 110. As shown in FIG. 2B and FIG. 2C, the wavelength conversion substrate 120a in the embodiment is located between the clamping element 130a and the driving assembly 110, but the invention is not limited thereto. In another embodiment, referring to FIG. 2E, in the wavelength conversion module 100b, the clamping element 130a may also be located between the wavelength conversion substrate 120a and the driving assembly 110.

In more detail, the wavelength conversion substrate 120a in the embodiment includes a disc substrate 122a, at least one wavelength conversion layer (three wavelength conversion layers 124a are schematically shown), and a light-transmitting plate 126a. The wavelength conversion substrate 120a has a holding region 121a, a light conversion region 123a, and a non-light conversion region 125a. The disc substrate 122a corresponds to the holding region 121a and the light conversion region 123a. The recesses 132a of the clamping element 130a are located in the holding region 121a of the wavelength conversion substrate 120a, the light conversion region 123a and the non-light conversion region 125a surround the holding region 121a, and the non-light conversion region 125a is adjacent to the light conversion region 123a. In other words, a projection of the recesses 132a of the clamping element 130a along the central axis X is located in the holding region 121a of the wavelength conversion substrate 120a. The wavelength conversion layers 124a are disposed on the disc substrate 122a and located in the light conversion region 123a. The light-transmitting plate 126a is located in the non-light conversion region 125a, and the light-transmitting plate 126a and the disc substrate 122a define a hollow ring. In the embodiment, the holding region 121a corresponds to a central position of the wavelength conversion substrate 120.

Furthermore, referring to FIG. 2C again, the recesses 132a of the clamping element 130a in the embodiment are substantially recessed on a surface 131a of the clamping element 130a, and the surface 131a of the clamping element 130a is attached to the wavelength conversion substrate 120a. Herein, the recesses 132a are formed on the clamping element 130a through stamping, and therefore production costs will not increase. Furthermore, the recesses 132a in the embodiment extend outward from a hollow hole 133a of the clamping element 130a to an outer circumference 135a. A width of the recess 132a gradually increases from the hollow hole 133a to the outer circumference 135a, and a shape of the recess 132a is curved. Preferably, a number of recesses 132a is greater than or equal to 2 and less than or equal to 6. Only three recesses 132a are schematically shown herein. In addition, the recesses 132a in the embodiment may be arranged radially by using the hollow hole 133a of the clamping element 130a as a center, but the invention is not limited thereto. In an embodiment, the recesses 132a may also be arranged asymmetrically, which still belongs to the protection scope of the invention.

In addition, referring to all of FIG. 2A, FIG. 2C, and FIG. 2D again, the through holes 134a of the clamping element 130a in the embodiment are located in the recesses 132a and relatively adjacent to the central axis X. The through holes 134a are in communication with the heat dissipation channel H1. The through holes 134a of the clamping element 130a are disposed on an end of the recesses 132a relatively far away from the outer circumference 135a. The through holes 134a are relatively close to the hollow hole 133a and disposed around the hollow hole 133a. Since the through holes 134a in the embodiment are located in the recesses 132a, relatively adjacent to the central axis, and in communication with the heat dissipation channel H1, during rotation of the wavelength conversion module 100a, a heat-dissipation airflow A can flow into the recesses 132a from the outside to the inside, and can be directly guided around the central axis X to be dissipated through the through hole 134a. In other words, in the embodiment, heat dissipation efficiency around the central axis X is improved through forced heat dissipation. In other words, the through holes 134a disposed in the embodiment may be configured to dissipate, from outside to inside, heat dissipation gas passing through the recesses 132a. In this way, a temperature of the clamping element 130a is lower than a temperature of the wavelength conversion substrate 120a, so that the wavelength conversion module 100a in the embodiment can have a better heat dissipation effect. In addition, since the temperature of the clamping element 130a is lowered, reliability and a life of a balance substance (not shown) pasted thereon can be increased.

In short, in designing of the wavelength conversion module 100a in the embodiment, the clamping element 130a, the recesses 132a, and the wavelength conversion substrate 120a can define the heat dissipation channels H1, thereby increasing the heat dissipation area. Furthermore, since the through holes 134a are located in the recesses 132a, relatively adjacent to the central axis X, and in communication with the heat dissipation channels H1, during rotation of the wavelength conversion module 100a, the heat dissipation airflow A can be directly directed around the central axis C, to improve the heat dissipation efficiency around the central axis X through forced heat dissipation. In this way, heat accumulation is reduced through forced heat dissipation, so that the wavelength conversion module 100a in the embodiment can have a better heat dissipation effect. In addition, a projector 10 adopting the wavelength conversion module 100a in the embodiment can have better projection quality and product competitiveness.

In the above embodiment, the width of the recess 132a of the clamping element 130a gradually increases from the hollow hole 133a to the outer circumference 135a, and the shape of the recess 132a is curved. However, the invention is not limited thereto. Designing of recesses of different clamping elements are described below with reference to with FIG. 3A to FIG. 3D.

It needs to be noted herein that, element numerals and partial content of the foregoing embodiments are still used in the following embodiments, where same numerals are used for indicating same or similar elements, and descriptions of same technical content are omitted. For descriptions of the omitted part, reference may be made to the foregoing embodiment, and are not repeated in the following embodiments.

Figure 3A:
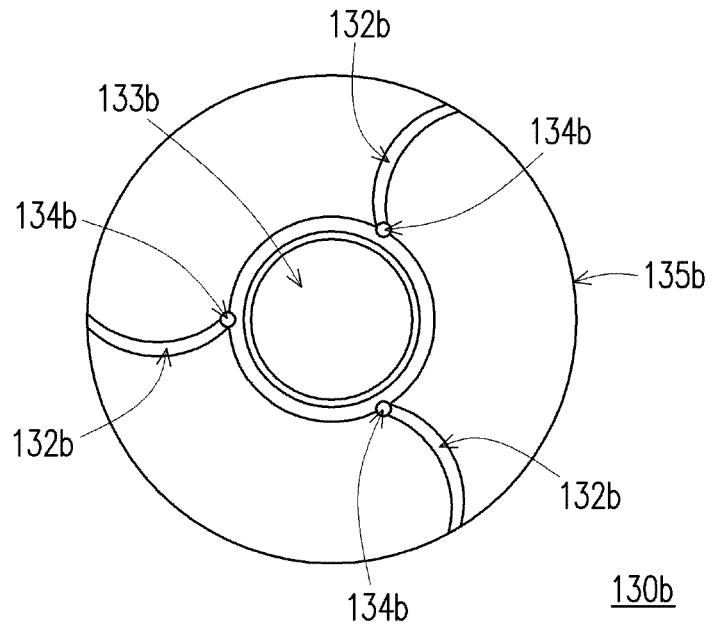
FIG. 3A to FIG. 3D are schematic top views of various clamping elements according to various embodiments of the invention.

FIG. 3A to FIG. 3D are schematic top views of various clamping elements according to various embodiments of the invention. Referring to both FIG. 2C and FIG. 3A first, a clamping element 130b in the embodiment of FIG. 3A is similar to the clamping element 130a in FIG. 2C. A difference between the two is that a shape of a recess 132b in the present embodiment is curved, a width of the recess 132b is uniform from a hollow hole 133b to an outer circumference 135b, and a through hole 134b is located in the recess 132b and is disposed on an end of the recess 132b relatively far away from the outer circumference 135b of the clamping element 130b.

Figure 3B:
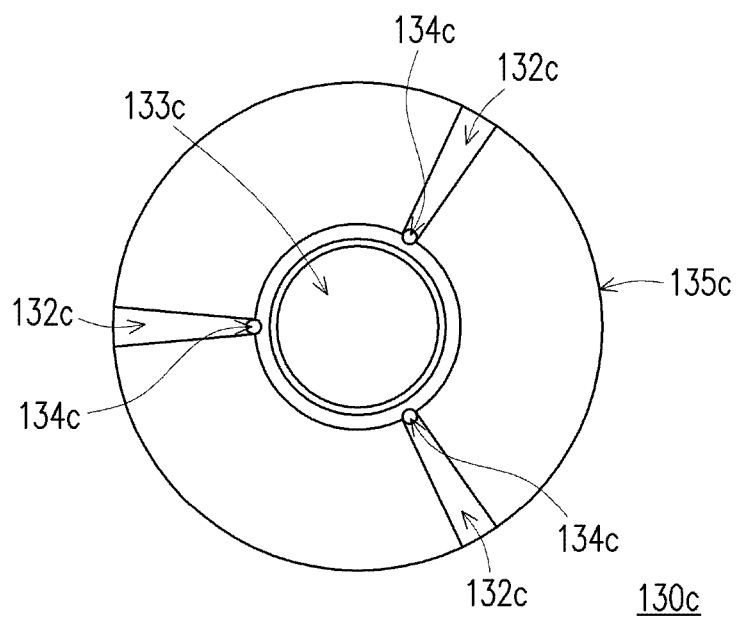

Referring to both FIG. 2C and FIG. 3B, a clamping element 130c in the embodiment of FIG. 3B is similar to the clamping element 130a in FIG. 2C. A difference between the two is that a shape of a recess 132c in the present embodiment is linear, a width of the recess 132c gradually increases from a hollow hole 133c to an outer circumference 135c, and a through hole 134c is located in the recess 132c and is disposed on an end of the recess 132c relatively far away from the outer circumference 135c of the clamping element 130c.

Figure 3C:
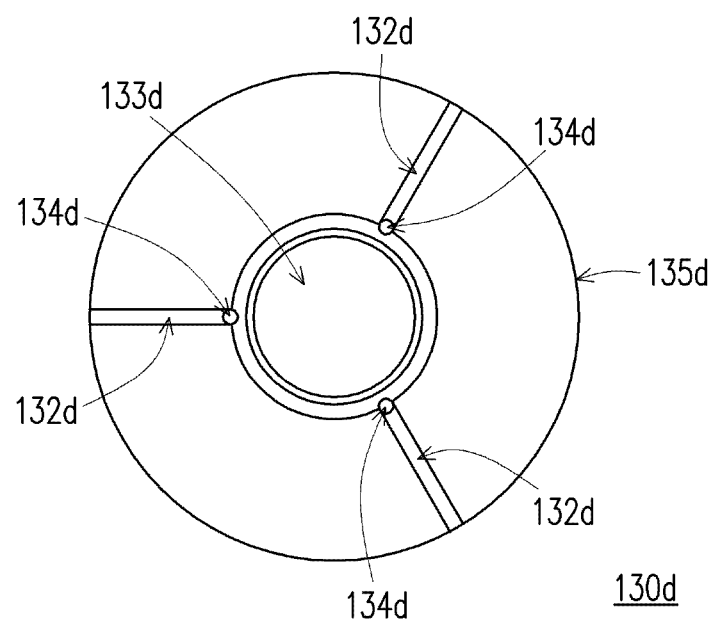

Referring to both FIG. 3B and FIG. 3C, a clamping element 130d in the embodiment of FIG. 3C is similar to the clamping element 130c in FIG. 3B. A difference between the two is that a width of a recess 132d is uniform from a hollow hole 133d to an outer circumference 135d, and a through hole 134d is located in the recess 132d and is disposed on an end of the recess 132d relatively far away from the outer circumference 135d of the clamping element 130d.

Figure 3D:
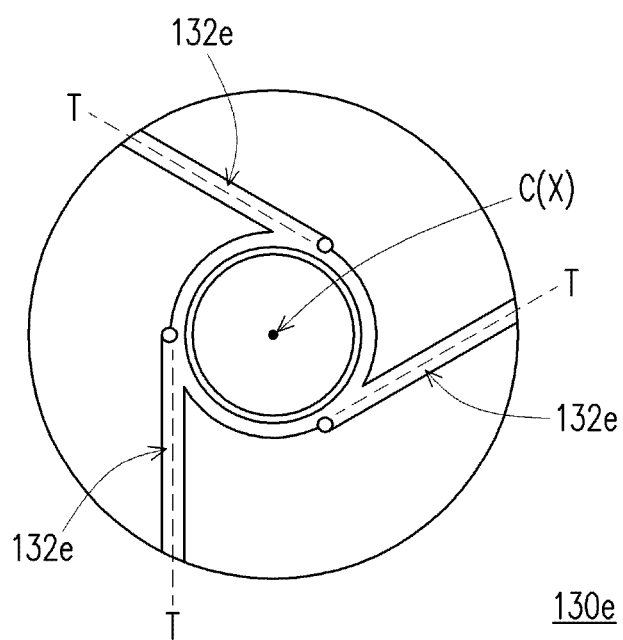

Referring to both FIG. 3C and FIG. 3D, a clamping element 130e in the embodiment of FIG. 3D is similar to the clamping element 130d in FIG. 3C. A difference between the two is that a centerline T of the recess 132e in the present embodiment deviates from the central axis center X and perpendicular to the central axis X. In other words, an extending direction of the recess 132e in the present embodiment substantially deviated from the central axis X, in another words, the extending direction of the recess 132e and the central axis X has no intersection with each other.

Figure 4A:
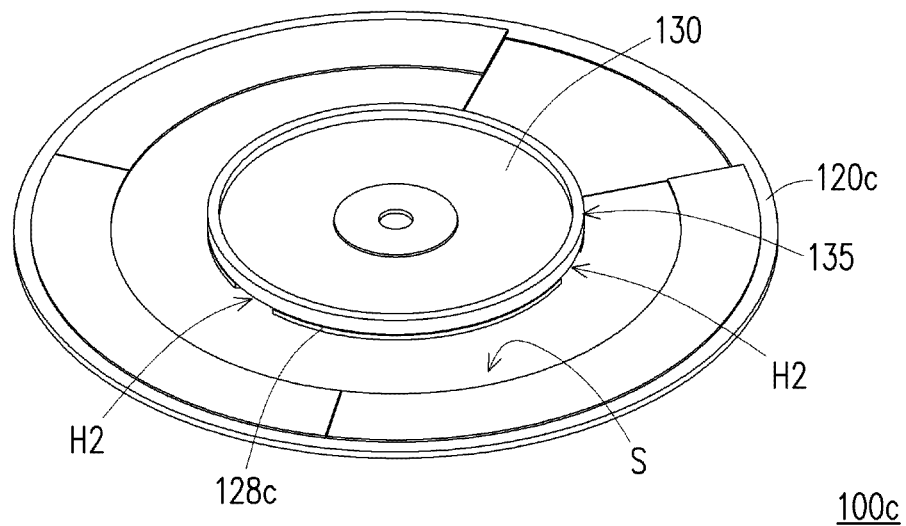
FIG. 4A is a three-dimensional schematic diagram of a wavelength conversion module according to another embodiment of the invention.
Figure 4B:
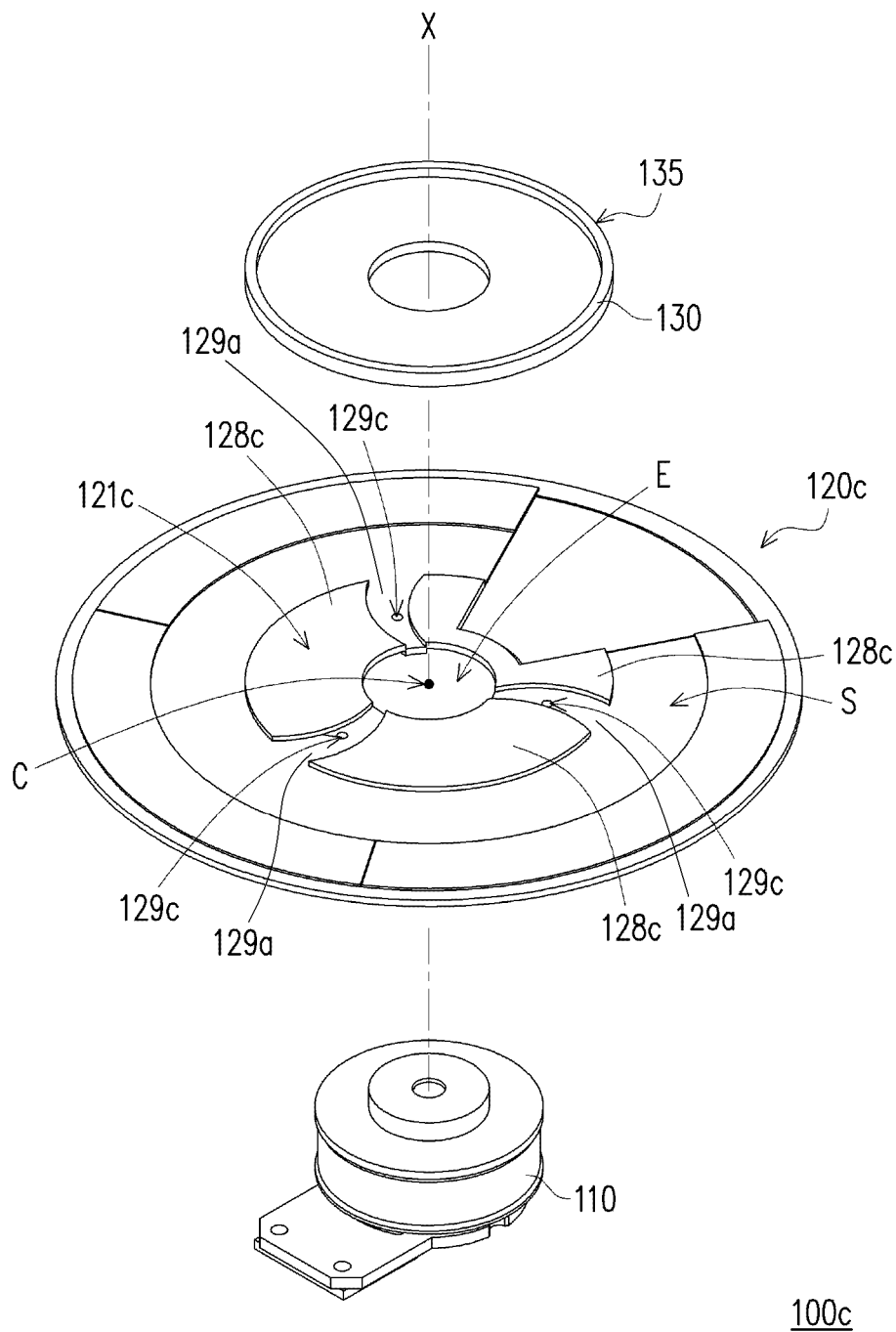
FIG. 4B is a three-dimensional schematic exploded view of the wavelength conversion module in FIG. 4A.
Figure 4C:
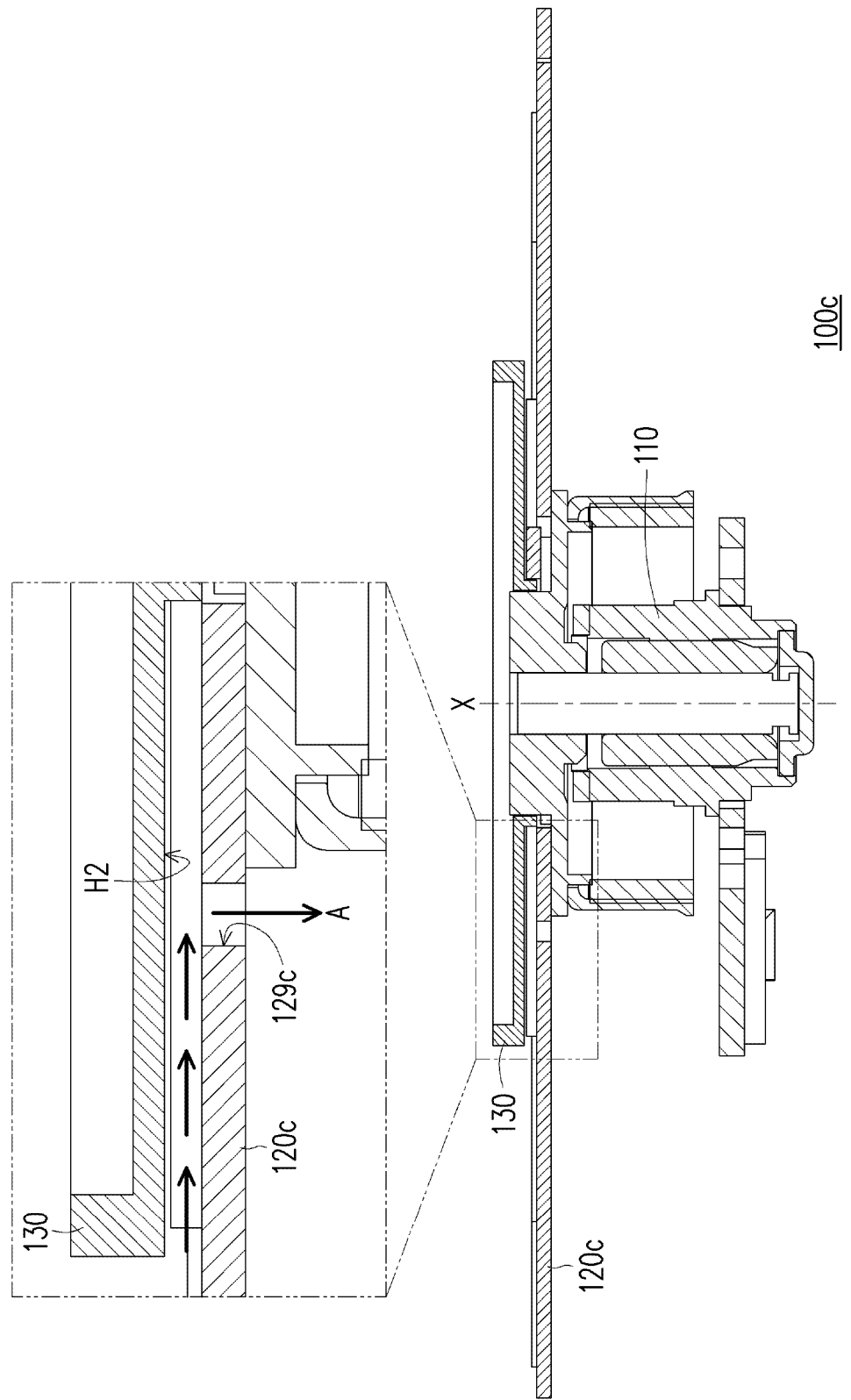
FIG. 4C is a schematic cross-sectional view of the wavelength conversion module in FIG. 4A.

FIG. 4A is a three-dimensional schematic diagram of a wavelength conversion module according to another embodiment of the invention. FIG. 4B is a three-dimensional schematic exploded view of the wavelength conversion module in FIG. 4A. FIG. 4C is a schematic cross-sectional view of the wavelength conversion module in FIG. 4A.

Referring to all of FIG. 2C, FIG. 4A, FIG. 4B, and FIG. 4C, a wavelength conversion module 100c in the embodiment is similar to the wavelength conversion module 100a in FIG. 2C. A difference between the two is that a clamping element 130 in the embodiment includes no recesses and through holes, but a wavelength conversion substrate 120c includes recesses 129a and through holes 129c.

In detail, a surface S of the wavelength conversion substrate 120c has a plurality of protrusions 128c, spaces between adjacent two of the plurality of protrusions 128c are recesses 129a, and the clamping element 130 is attached to the surface S of the wavelength conversion substrate 120c. In other words, the recesses 129a are recessed on the surface S of the wavelength conversion substrate 120c. Herein, the plurality of protrusions 128c facing the clamping element 130 formed through stamping, and therefore production costs do not increase. The recesses 129a extend outward from a hollow hole E of the wavelength conversion substrate 120c to an outer circumference 135 of the clamping element 130. The recesses 129a are located in a holding region 121c of the wavelength conversion substrate 120c. A width of the recess 129a gradually increases from the hollow hole E to the outer circumference 135 of the clamping element 130, and a shape of the recess 129a is curved herein, but the invention is not limited thereto.

Furthermore, a direction of the through holes 129c in the embodiment is parallel to the central axis X, and the through holes 129c penetrate the wavelength conversion substrate 120c. Herein, the through holes 129c are disposed adjacent to the hollow hole E and located in the recess 129a herein. In particular, the clamping element 130, the recess 129a, and the wavelength conversion substrate 120c define heat dissipation channels H2. The through holes 129c are in communication with the heat dissipation channels H2. Therefore, during rotation of the wavelength conversion module 100c, the heat dissipation airflow A can be directly directed around the central axis X, to improve the heat dissipation efficiency around the central axis X through forced heat dissipation. In this way, the wavelength conversion module 100c in the embodiment can have a better heat dissipation effect.

Figure 5A:
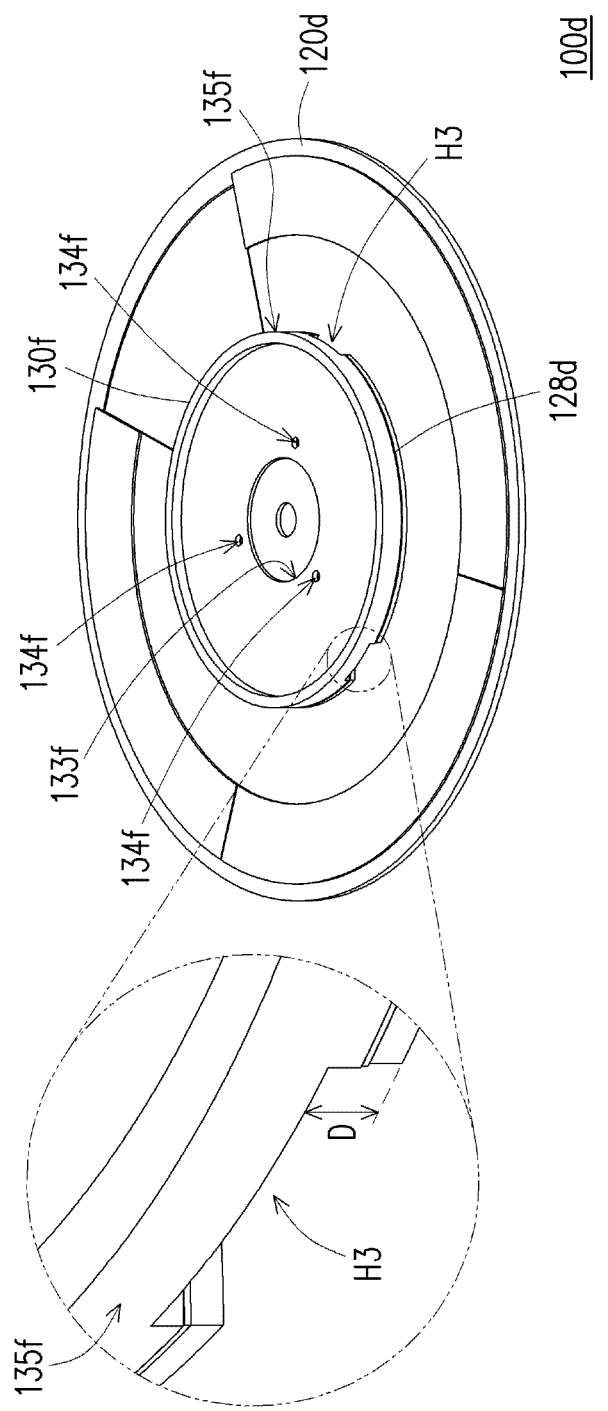
FIG. 5A is a three-dimensional schematic diagram of a wavelength conversion module according to another embodiment of the invention.
Figure 5B:
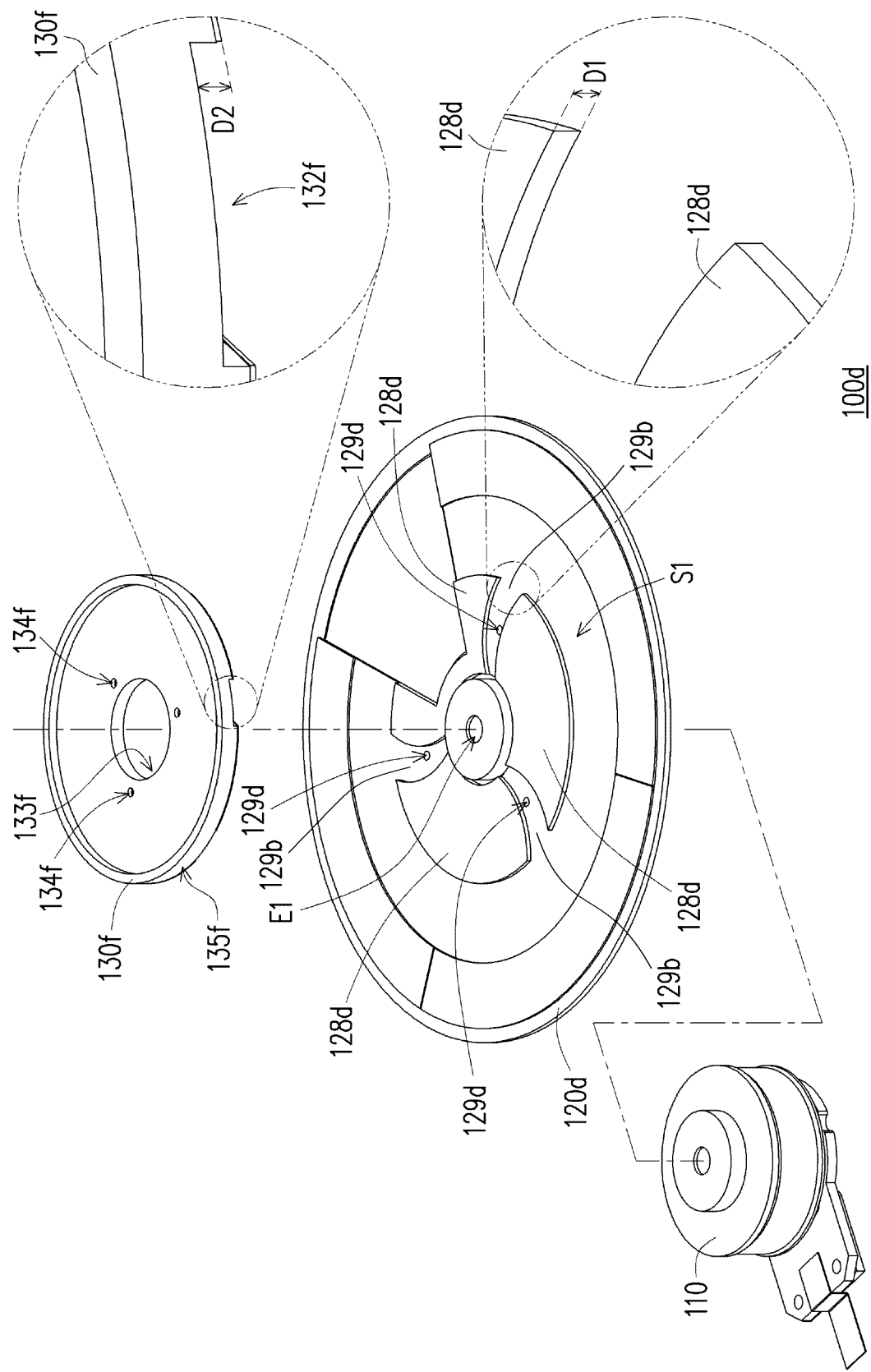
FIG. 5B is a three-dimensional schematic exploded view of the wavelength conversion module in FIG. 5A.
Figure 5C:
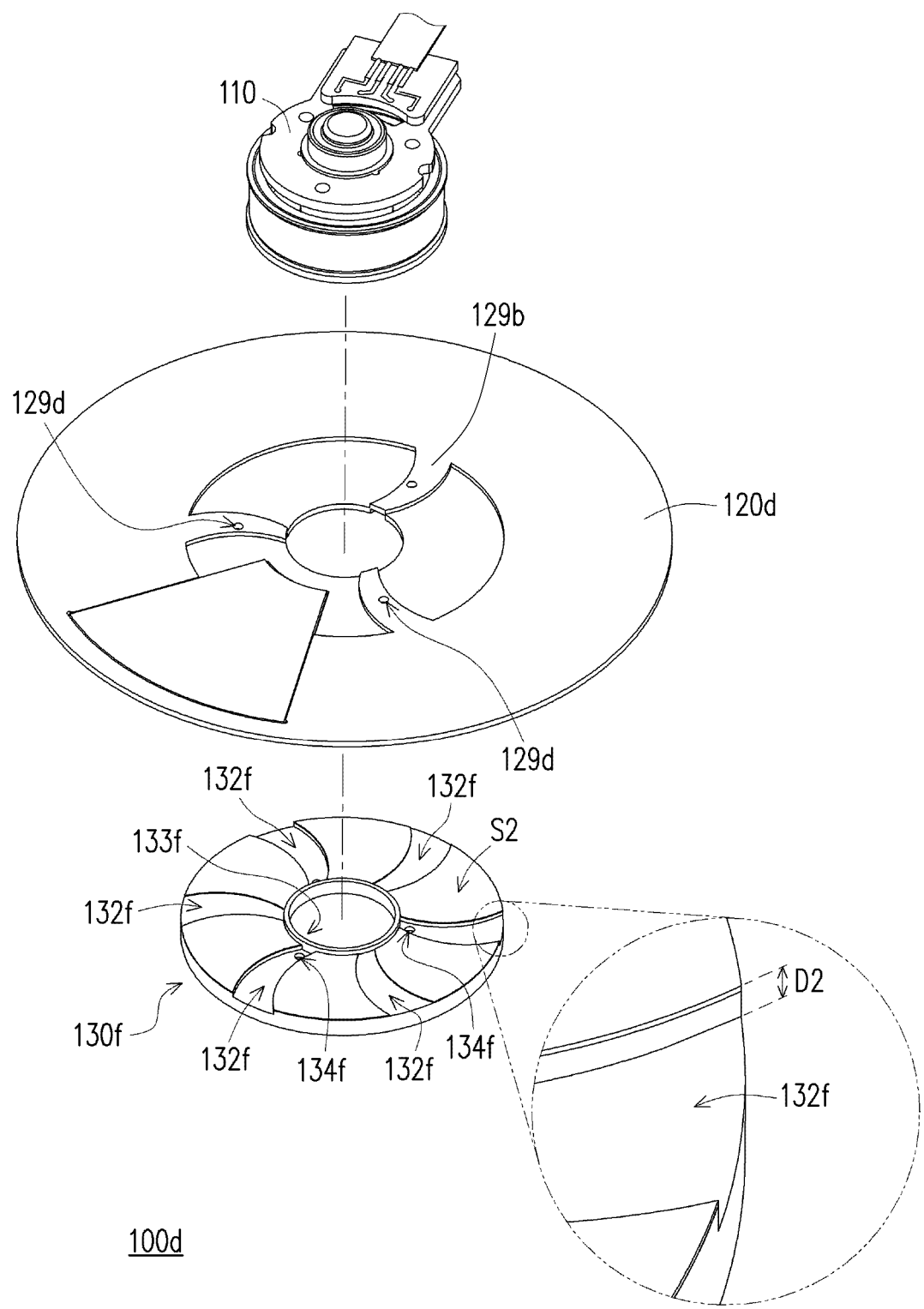
FIG. 5C is a three-dimensional schematic exploded view of the wavelength conversion module in FIG. 5A from another perspective.
Figure 5D:
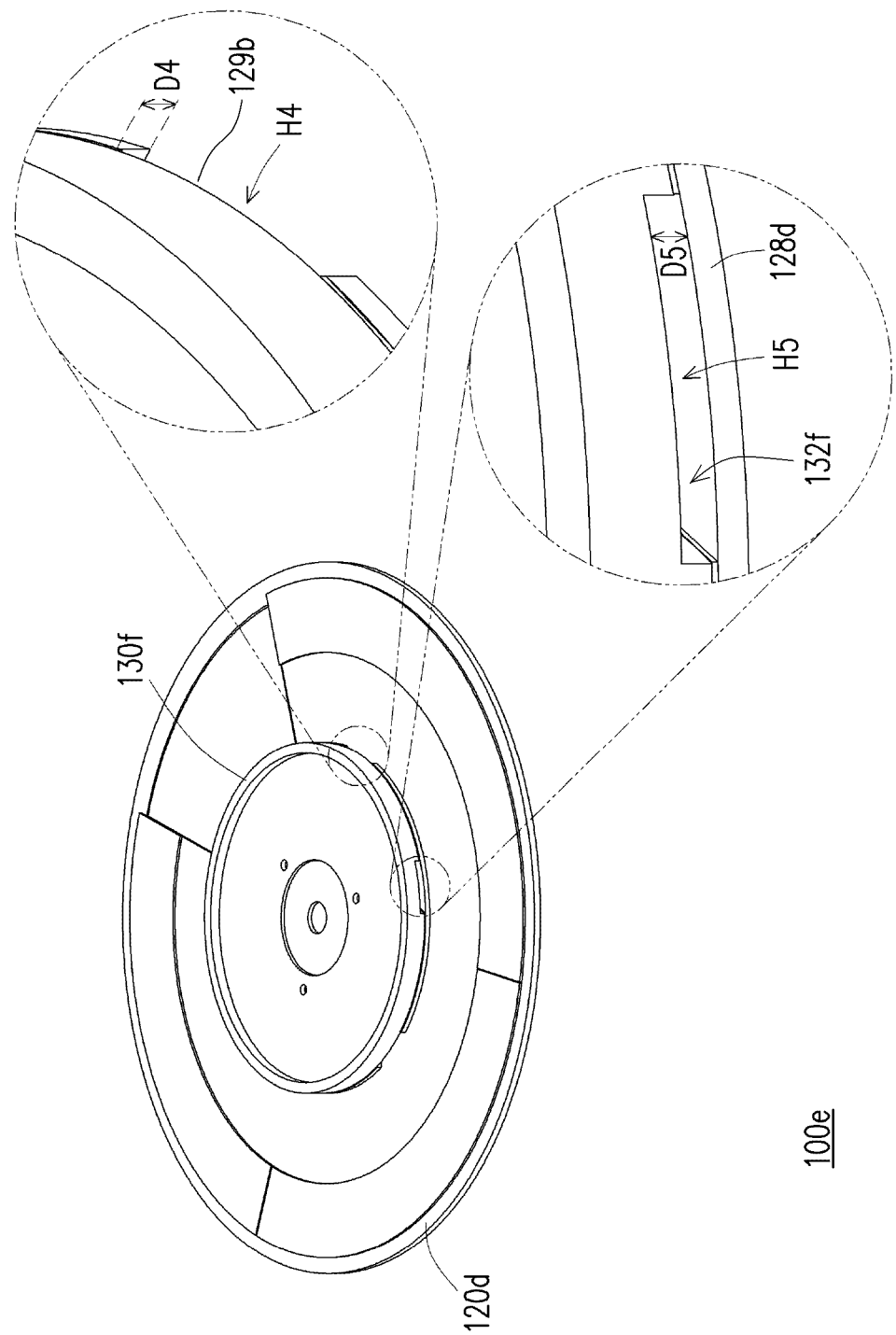
FIG. 5D is a three-dimensional schematic diagram of a wavelength conversion module according to another embodiment of the invention.

FIG. 5A is a three-dimensional schematic diagram of a wavelength conversion module according to another embodiment of the invention. FIG. 5B is a three-dimensional schematic exploded view of the wavelength conversion module in FIG. 5A. FIG. 5C is a three-dimensional schematic exploded view of the wavelength conversion module in FIG. 5A from another perspective. FIG. 5D is a three-dimensional schematic diagram of a wavelength conversion module according to another embodiment of the invention.

Referring to all of FIG. 2B, FIG. 2C, FIG. 5A, FIG. 5B, and FIG. 5C, a wavelength conversion module 100d in the embodiment is similar to the wavelength conversion module 100a in FIG. 2B. A difference between the two is that a wavelength conversion substrate 120d in the embodiment includes first recesses 129b and first through holes 129d penetrating the wavelength conversion substrate 120d. A clamping element 130f includes second recesses 132f and second through holes 134f penetrating the clamping element 130f. The first recesses 129b are recessed on a first surface S1 of the wavelength conversion substrate 120d and extend outward from a first hollow hole E1 of the wavelength conversion substrate 120d to an outer circumference 135f of the clamping element 130f. In other words, the first surface S1 of the wavelength conversion substrate 120d has a plurality of protrusions 128d, and spaces between adjacent two of the plurality of protrusions 128d are first recesses 129b. The second recesses 132f are recessed on the second surface S2 of the clamping element 130f and extend outward from the second hollow hole 133f of the clamping element 130f to the outer circumference 135f. A width of the first recess 129b gradually increases from the hollow hole E1 to the outer circumference 135f of the clamping element 130f, and a shape of the first recess 129b is curved herein, but the invention is not limited thereto. A width of the second recess 132f gradually increases from a second hollow hole 133f to the outer circumference 135f, and a shape of the second recess 132f is curved, but the invention is not limited thereto. The first through holes 129d are located in the first recesses 129b, and the second through holes 134f are located in the second recesses 132f.

Furthermore, in the embodiment, when the clamping element 130f is attached to the wavelength conversion substrate 120d, the first recesses 129b and the second recesses 132f may overlap, that is, the first recesses 129b are attached to the second recesses 132f to define heat dissipation channels H3. The first through holes 129d and the second through holes 134f are in communication with the heat dissipation channels H3. In this case, a depth D of the heat dissipation channel H3 is equal to a height D1 by which the first recess 129b is recessed on the first surface S1 of the wavelength conversion substrate 120d plus a depth D2 by which the second recess 132f is recessed on the surface S2 of the clamping element 130f, so that a better heat dissipation area can be obtained, and heat dissipation efficiency of the wavelength conversion module 100d can be improved.

In another embodiment, referring to all of FIG. 5B, FIG. 5C, and FIG. 5D, when the clamping element 130f is attached to the wavelength conversion substrate 120d, the first recesses 129b and the second recesses 132f do not overlap. In this case, the heat dissipation channel includes at least one first heat dissipation channel H4 and at least one second heat dissipation channel H5, that is, the first recess 129b overlaps the second surface S2 of the clamping element 130f so that the first recess 129b defines the first heat dissipation channel H4, and the first surface S1 of the wavelength conversion substrate 120d overlaps the second recess 132f so that the second recess 132f defines the second heat dissipation channel H5. A first depth D4 of the first heat dissipation channel H4 is equal to the height D1 of the first recess 129b, and a second depth D5 of the second heat dissipation channel H5 is equal to the depth D5 of the second recess 132f. In this way, the wavelength conversion module 100e in the embodiment can have a plurality of heat dissipation paths, and can have a better heat dissipation effect.

Based on the above description, the embodiments of the invention have at least one of the following advantages or effects. In the design of the wavelength conversion module of the invention, at least one of the wavelength conversion substrate and the clamping element includes at least one recess and at least one through hole, the clamping element, the recess, and the wavelength conversion substrate define at least one heat dissipation channel, and the through hole extends along an axial direction, and is relatively adjacent to the central axis and in communication with the heat dissipation channel. Therefore, during rotation of the wavelength conversion module, a heat dissipation airflow can be directly directed around the central axis, and the heat dissipation efficiency around the central axis can be increased through forced heat dissipation. In this way, the wavelength conversion module of the invention can have a better heat dissipation effect. In addition, a projector adopting the wavelength conversion module of the invention can have better projection quality and product competitiveness.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion module, comprising a driving assembly, a wavelength conversion substrate, and a clamping element, wherein
the driving assembly is connected to the wavelength conversion substrate to drive the wavelength conversion substrate to rotate around a central axis of the driving assembly;
the clamping element is attached to the wavelength conversion substrate along the central axis; and
one of the wavelength conversion substrate and the clamping element comprises at least one recess and at least one through hole, a direction of the at least one through hole is parallel to the central axis, the clamping element, the at least one recess, and the wavelength conversion substrate define at least one heat dissipation channel, and the at least one through hole is disposed relatively adjacent to the central axis and is in communication with the at least one heat dissipation channel, wherein the at least one recess is covered by the other one of the wavelength conversion substrate and the clamping element along a direction of the central axis.

2. The wavelength conversion module according to claim 1, wherein a shape of the wavelength conversion substrate and a shape of the clamping element are respectively a hollow ring, and the wavelength conversion substrate and the clamping element are respectively disposed coaxially with the driving assembly.

3. The wavelength conversion module according to claim 2, wherein the clamping element comprises the at least one recess, the at least one recess is recessed on a surface of the clamping element, the at least one through hole is located in the at least one recess, the surface of the clamping element is attached to the wavelength conversion substrate, and the at least one recess extends outward to an outer circumference from a hollow hole of the clamping element.

4. The wavelength conversion module according to claim 3, wherein a shape of the at least one recess comprises a linear shape or a curved shape.

5. The wavelength conversion module according to claim 4, wherein a width of the at least one recess gradually increases from the hollow hole to the outer circumference.

6. The wavelength conversion module according to claim 4, wherein a width of the at least one recess is uniform from the hollow hole to the outer circumference.

7. The wavelength conversion module according to claim 4, wherein a centerline of the at least one recess deviates from the central axis and is perpendicular to the central axis.

8. The wavelength conversion module according to claim 2, wherein the wavelength conversion substrate comprises the at least one recess and the at least one through hole, the at least one recess is recessed on a surface of the wavelength conversion substrate, and the at least one through hole is located in the at least one recess, the clamping element is attached to the surface of the wavelength conversion substrate, and the at least one recess extends outward from a hollow hole of the wavelength conversion substrate to an outer circumference of the clamping element.

9. The wavelength conversion module according to claim 8, wherein the wavelength conversion substrate comprises a disc substrate, at least one wavelength conversion layer, and a light-transmitting plate, and the wavelength conversion substrate has a holding region, a light conversion region, and a non-light conversion region, wherein
the disc substrate corresponds to the holding region and the light conversion region, wherein the at least one recess is located in the holding region, the light conversion region and the non-light conversion region surround the holding region, and the non-light conversion region is adjacent to the light conversion region;
the at least one wavelength conversion layer is disposed on the disc substrate and is located in the light conversion region; and
the light-transmitting plate is located in the non-light conversion region.

10. The wavelength conversion module according to claim 1, wherein the at least one recess comprises a plurality of recesses, and a number of the plurality of recesses is greater than or equal to 2 and less than or equal to 6.

11. The wavelength conversion module according to claim 10, wherein the plurality of recesses are arranged radially or asymmetrically.

12. The wavelength conversion module according to claim 1, wherein the wavelength conversion substrate is located between the clamping element and the driving assembly.

13. The wavelength conversion module according to claim 1, wherein the clamping element is located between the wavelength conversion substrate and the driving assembly.

14. The wavelength conversion module according to claim 1, wherein a temperature of the clamping element is lower than a temperature of the wavelength conversion substrate.

15. A wavelength conversion module, comprising a driving assembly, a wavelength conversion substrate, and a clamping element, wherein
the driving assembly is connected to the wavelength conversion substrate to drive the wavelength conversion substrate to rotate around a central axis of the driving assembly;
the clamping element is attached to the wavelength conversion substrate along the central axis; and
at least one of the wavelength conversion substrate and the clamping element comprises at least one recess and at least one through hole, a direction of the at least one through hole is parallel to the central axis, the clamping element, the at least one recess, and the wavelength conversion substrate define at least one heat dissipation channel, and the at least one through hole is disposed relatively adjacent to the central axis and is in communication with the at least one heat dissipation channel;
wherein a shape of the wavelength conversion substrate and a shape of the clamping element are respectively a hollow ring, and the wavelength conversion substrate and the clamping element are respectively disposed coaxially with the driving assembly;
wherein the at least one recess comprises at least one first recess and at least one second recess, the wavelength conversion substrate comprises the at least one first recess, the clamping element comprises the at least one second recess, the at least one first recess is recessed on a first surface of the wavelength conversion substrate and extends outward from a first hollow hole of the wavelength conversion substrate to an outer circumference of the clamping element, and the at least one second recess is recessed on a second surface of the clamping element and extends outward from a second hollow hole of the clamping element to the outer circumference.

16. The wavelength conversion module according to claim 15, wherein when the clamping element is attached to the wavelength conversion substrate, the at least one first recess and the at least one second recess overlap to define the at least one heat dissipation channel.

17. The wavelength conversion module according to claim 16, wherein a depth of the at least one heat dissipation channel is equal to a height of the at least one first recess plus a depth of the at least one second recess.

18. The wavelength conversion module according to claim 15, wherein when the clamping element is attached to the wavelength conversion substrate, the at least one first recess and the at least one second recess do not overlap.

19. The wavelength conversion module according to claim 18, wherein the at least one heat dissipation channel comprises at least one first heat dissipation channel and at least one second heat dissipation channel, the at least one first recess overlaps the second surface of the clamping element so that the at least one first heat dissipation channel is defined by the at least one first recess, a first depth of the at least one first heat dissipation channel is equal to a height of the at least one first recess, the at least one second recess overlaps the first surface of the wavelength conversion substrate so that the at least one second heat dissipation channel is defined by the at least one second recess, and a second depth of the at least one second heat dissipation channel is equal to a depth of the at least one second recess.

20. A projector, comprising an illumination module, a light valve, and a projection lens, wherein
- the illumination module is configured to provide an illumination beam, and comprises a light source apparatus and a wavelength conversion module, wherein
  - the light source apparatus is configured to provide an excitation beam; and
  - the wavelength conversion module is configured to receive the excitation beam, is disposed on a transmission path of the illumination beam, and comprises a driving assembly, a wavelength conversion substrate, and a clamping element, wherein
    - the driving assembly is connected to the wavelength conversion substrate to drive the wavelength conversion substrate to rotate around a central axis of the driving assembly;
    - the clamping element is attached to the wavelength conversion substrate along the central axis; and
    - one of the wavelength conversion substrate and the clamping element comprises at least one recess and at least one through hole, a direction of the at least one through hole is parallel to the central axis, wherein the clamping element, the at least one recess, and the wavelength conversion substrate define at least one heat dissipation channel, and the at least one through hole is disposed relatively adjacent to the central axis and is in communication with the at least one heat dissipation channel, wherein the at least one recess is covered by the other one of the wavelength conversion substrate and the clamping element along a direction of the central axis;
- the light valve is disposed on the transmission path of the illumination beam to convert the illumination beam into an image beam; and
- the projection lens is disposed on a transmission path of the image beam to project the image beam from the projector.

* * * * *